(12) United States Patent
Wang et al.

(10) Patent No.: US 12,538,574 B2
(45) Date of Patent: Jan. 27, 2026

(54) ARRAY SUBSTRATE, DISPLAY APPARATUS, AND CONNECTION PAD

(71) Applicant: BOE Technology Group Co., Ltd., Beijing (CN)

(72) Inventors: Guoying Wang, Beijing (CN); Pan Xu, Beijing (CN); Dacheng Zhang, Beijing (CN); Xing Zhang, Beijing (CN); Ying Han, Beijing (CN); Chengyuan Luo, Beijing (CN); Zhen Song, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 698 days.

(21) Appl. No.: 17/904,748

(22) PCT Filed: Oct. 18, 2021

(86) PCT No.: PCT/CN2021/124320
§ 371 (c)(1),
(2) Date: Aug. 22, 2022

(87) PCT Pub. No.: WO2023/065062
PCT Pub. Date: Apr. 27, 2023

(65) Prior Publication Data
US 2024/0194688 A1 Jun. 13, 2024

(51) Int. Cl.
*H10D 86/40* (2025.01)
*H10K 59/131* (2023.01)

(52) U.S. Cl.
CPC ......... *H10D 86/441* (2025.01); *H10K 59/131* (2023.02)

(58) Field of Classification Search
CPC .............. H10D 86/441; H10K 59/131; G02F 1/136286
See application file for complete search history.

(56) References Cited

U.S. PATENT DOCUMENTS

2001/0019125 A1* 9/2001 Hong ................... H10D 86/441
257/59
2007/0178614 A1 8/2007 Arasawa et al.
(Continued)

FOREIGN PATENT DOCUMENTS

CN 101013695 A 8/2007
CN 204287637 U 4/2015
(Continued)

OTHER PUBLICATIONS

International Search Report & Written Opinion mailed Jul. 13, 2022, regarding PCT/CN2021/124320.

*Primary Examiner* — Peter M Albrecht
(74) *Attorney, Agent, or Firm* — Intellectual Valley Law, P.C.

(57) ABSTRACT

An array substrate having a connection pad in a connection pad area is provided. The connection pad includes a plurality of first probe contact pads, a plurality of second probe contact pads, a plurality of first connection lines coupled to the plurality of first probe contact pads, respectively, and a plurality of second connection lines coupled to the plurality of second probe contact pads, respectively; the plurality of first connection lines and the plurality of second connection lines being in two different layers. A total number of conductive layers electrically connected to a respective first connection line of the plurality of first connection lines is different from a total number of conductive layers electrically connected to a respective second connection line of the plurality of second connection lines.

19 Claims, 13 Drawing Sheets

(56) References Cited

U.S. PATENT DOCUMENTS

2011/0254011 A1\* 10/2011 Kim .................... H10D 86/441
  257/72
2017/0301741 A1  10/2017 Chan et al.
2020/0295117 A1  9/2020 Park et al.

FOREIGN PATENT DOCUMENTS

| CN | 105259722 A | 1/2016 |
| CN | 108878484 A | 11/2018 |
| CN | 109491121 A | 3/2019 |
| CN | 111697030 A | 9/2020 |
| CN | 211428122 U | 9/2020 |
| CN | 212161816 U | 12/2020 |
| JP | 2012226156 A | 11/2012 |
| JP | 2013257443 A | 12/2013 |

\* cited by examiner

ARRAY SUBSTRATE, DISPLAY APPARATUS, AND CONNECTION PAD

CROSS-REFERENCE TO RELATED APPLICATION

This application is a national stage application under 35 U.S.C. § 371 of International Application No. PCT/CN2021/124320, filed Oct. 18, 2021, the contents of which are incorporated by reference in the entirety.

TECHNICAL FIELD

The present invention relates to display technology, more particularly, to an array substrate, a display apparatus, and a connection pad.

BACKGROUND

Typically, a display panel includes a display area and a peripheral area. The display panel includes a plurality of semiconductor elements in the display area. In the manufacturing process of a display panel, the electrical properties of the plurality of semiconductor elements need to be tested to ensure they function properly. To assess electrical properties of the semiconductor elements in the display panel, a pattern of measuring elements, test element group, is formed in the peripheral area of the display panel. The test element group is electrically tested for determining whether semiconductor elements are suitably formed in the display panel.

SUMMARY

In one aspect, the present disclosure provides an array substrate, comprising a connection pad in a connection pad area; wherein the connection pad comprises a plurality of first probe contact pads, a plurality of second probe contact pads, a plurality of first connection lines coupled to the plurality of first probe contact pads, respectively, and a plurality of second connection lines coupled to the plurality of second probe contact pads, respectively; the plurality of first connection lines and the plurality of second connection lines being in two different layers; and a total number of conductive layers electrically connected to a respective first connection line of the plurality of first connection lines is different from a total number of conductive layers electrically connected to a respective second connection line of the plurality of second connection lines.

Optionally, the array substrate comprises a base substrate; a second conductive layer on the base substrate; and a first conductive layer on a side of the second conductive layer away from the base substrate; wherein the first conductive layer comprises a first-first portion in a display area of the array substrate and a second-first portion in the connection pad area; the second conductive layer comprises a first-second portion in the display area and a second-second portion in the connection pad area; the second-first portion comprises the plurality of first connection lines; and the second-second portion comprises the plurality of second connection lines.

Optionally, the array substrate further comprises an insulating layer between the second-first portion and the second-second portion; wherein the insulating layer comprises an inter-layer dielectric layer, or a buffer layer, or a combination of the inter-layer dielectric layer and the buffer layer.

Optionally, the first conductive layer and the second conductive layer are two different layers selected from a gate metal layer, a source-drain electrode layer, or a light shielding layer.

Optionally, the second-first portion further comprises a plurality of first relay electrodes in a same layer as the plurality of first connection lines; wherein a respective first relay electrode of the plurality of first relay electrodes connects a respective second probe contact pad to a respective second connection line.

Optionally, the first-first portion comprises a plurality of source electrodes and a plurality of drain electrodes of a plurality of thin film transistors; and the plurality of source electrodes and the plurality of drain electrodes are in a same layer as the plurality of first connection lines and the plurality of first relay electrodes.

Optionally, the first-second portion comprises a plurality of gate lines, and a plurality of gate electrodes of a plurality of thin film transistors, respectively; and the plurality of gate lines and the plurality of gate electrodes are in a same layer as the plurality of second connection lines.

Optionally, the connection pad further comprises a plurality of third probe contact pads, and a plurality of third connection lines coupled to the plurality of third probe contact pads, respectively; the plurality of first connection lines, the plurality of second connection lines, and the plurality of third connection lines being in three different layers; and a total number of conductive layers electrically connected to a respective first connection line of the plurality of first connection lines is different from a total number of conductive layers electrically connected to a respective third connection line of the plurality of third connection lines.

Optionally, the array substrate further comprises a third conductive layer on a side of the second conductive layer closer to the base substrate; wherein the third conductive layer comprises a first-third portion in the display area and a second-third portion in the connection pad area; and the second-third portion comprises the plurality of third connection lines.

Optionally, the second-first portion further comprises a plurality of second relay electrodes in a same layer as the plurality of first connection lines; wherein a respective second relay electrode of the plurality of second relay electrodes connects a respective third probe contact pad to a respective third connection line.

Optionally, the first-third portion comprises a plurality of light shields in a same layer as the plurality of third connection lines; and an orthographic projection of a respective light shield on the base substrate covers a respective active layer of a respective thin film transistor.

Optionally, the array substrate further comprises an inter-layer dielectric layer between the second-first portion and the second-second portion; and a buffer layer between the second-second portion and the second-third portion.

Optionally, the first conductive layer is a source-drain electrode layer; the second conductive layer is a gate metal layer; and the third conductive layer is a light shielding layer.

Optionally, an orthographic projection of a respective first connection line on the base substrate is non-overlapping with an orthographic projection of a respective second connection line on the base substrate; the orthographic projection of the respective first connection line on the base substrate is non-overlapping with an orthographic projection of a respective third connection line on the base substrate; and the orthographic projection of the respective second connection line on the base substrate is non-overlapping with the orthographic projection of the respective third connection line on the base substrate.

Optionally, an orthographic projection of a respective first connection line on the base substrate is at least partially overlapping with an orthographic projection of a respective second connection line on the base substrate; the orthographic projection of the respective first connection line on the base substrate is at least partially overlapping with an orthographic projection of a respective third connection line on the base substrate; and the orthographic projection of the respective second connection line on the base substrate is at least partially overlapping with the orthographic projection of the respective third connection line on the base substrate.

Optionally, an orthographic projection of a respective first connection line on the base substrate is non-overlapping with an orthographic projection of a respective second connection line on the base substrate.

Optionally, an orthographic projection of a respective first connection line on the base substrate is at least partially overlapping with an orthographic projection of a respective second connection line on the base substrate.

Optionally, the array substrate further comprises an inter-layer dielectric layer on a side of the plurality of second connection lines away from the base substrate; a passivation layer on a side of the plurality of first connection lines away from the base substrate; and a resin layer on a side of the passivation layer away from the base substrate; wherein the plurality of first probe contact pads and the plurality of second probe contact pads are on a side of the resin layer away from the base substrate; wherein the array substrate further comprises a first via extending through the resin layer and the passivation layer, a respective first probe contact pad connected to a respective first connection line through the first via; a second via extending through the resin layer and the passivation layer, a respective second probe contact pad connected to the respective first relay electrode through the second via; and a third via extending through the inter-layer dielectric layer, the respective first relay electrode connected to a respective second connection line through the third via.

Optionally, the second-first portion further comprises a plurality of first relay electrodes in a same layer as the plurality of first connection lines; wherein a respective first relay electrode of the plurality of first relay electrodes connects a respective second probe contact pad to a respective second connection line; wherein the array substrate further comprises a buffer layer on a side of the plurality of third connection lines away from the base substrate; an inter-layer dielectric layer on a side of the plurality of second connection lines away from the base substrate; a passivation layer on a side of the plurality of first connection lines away from the base substrate; and a resin layer on a side of the passivation layer away from the base substrate; wherein the plurality of first probe contact pads and the plurality of second probe contact pads are on a side of the resin layer away from the base substrate; wherein the array substrate further comprises a first via extending through the resin layer and the passivation layer, a respective first probe contact pad connected to a respective first connection line through the first via; a second via extending through the resin layer and the passivation layer, a respective second probe contact pad connected to the respective first relay electrode through the second via; a third via extending through the inter-layer dielectric layer, the respective first relay electrode connected to a respective second connection line through the third via; a fourth via extending through the resin layer and the passivation layer, a respective third probe contact pad connected to the respective second relay electrode through the fourth via; and a fifth via extending through the inter-layer dielectric layer and the buffer layer, the respective second relay electrode connected to a respective third connection line through the fifth via.

In another aspect, the present disclosure provides a display apparatus, comprising the array substrate described herein or fabricated by a method described herein, and an integrated circuit connected to the array substrate.

In another aspect, the present disclosure provides a connection pad, comprising a plurality of first probe contact pads, a plurality of second probe contact pads, a plurality of first connection lines coupled to the plurality of first probe contact pads, respectively, and a plurality of second connection lines coupled to the plurality of second probe contact pads, respectively; the plurality of first connection lines and the plurality of second connection lines being in two different layers; wherein a total number of conductive layers electrically connected to a respective first connection line of the plurality of first connection lines is different from a total number of conductive layers electrically connected to a respective second connection line of the plurality of second connection lines.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, an array substrate, a display apparatus, and a connection pad that substantially obviate one or more of the problems due to limitations and disadvantages of the related art. In one aspect, the present disclosure provides an array substrate. In some embodiments, the array substrate includes a connection pad in a connection pad area. In some embodiments, the connection pad includes a plurality of first probe contact pads, a plurality of second probe contact pads, a plurality of first connection lines coupled to the plurality of first probe contact pads, respectively, and a plurality of second connection lines coupled to the plurality of second probe contact pads, respectively; the plurality of first connection lines and the plurality of second connection lines being in two different layers. Optionally, a total number of conductive layers electrically connected to a respective first connection line of the plurality of first connection lines is different from a total number of conductive layers electrically connected to a respective second connection line of the plurality of second connection lines.

Figure 1:
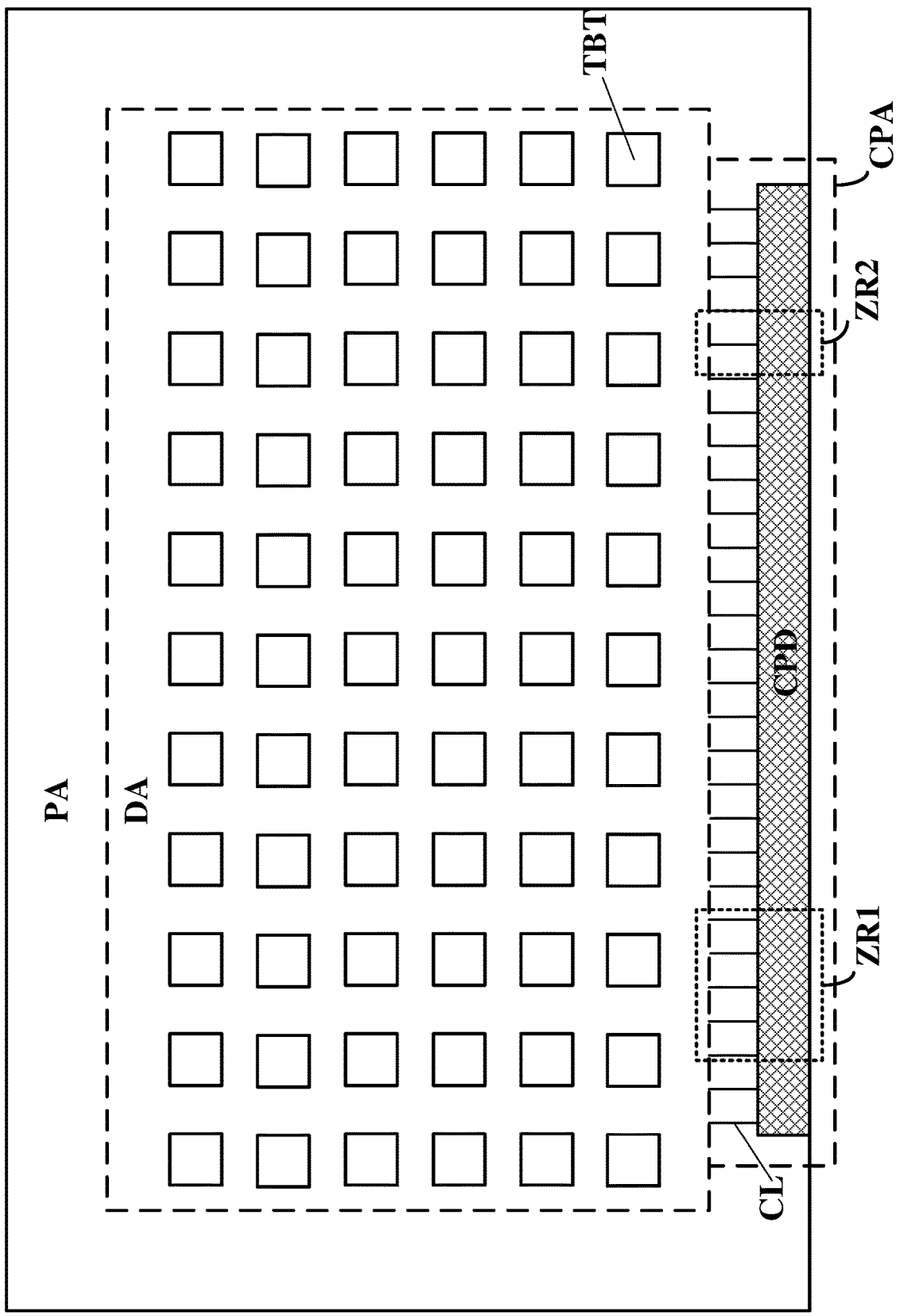
FIG. 1 is a schematic diagram illustrating an array substrate in some embodiments according to the present disclosure.

FIG. 1 is a schematic diagram illustrating an array substrate in some embodiments according to the present disclosure. Referring to FIG. 1, the array substrate in a display area DA includes a plurality of to-be-tested elements TBT. Examples of to-be-tested elements include transistors, capacitors, electrodes, connecting lines, and signal lines. The plurality of to-be-tested elements TBT includes to-be-tested semiconductor elements. The array substrate in a peripheral area PA includes a connection pad CPD and a plurality of connection lines CL connected to the connection pad CPD. The plurality of connection lines CL are electrically connected to the plurality of to-be-tested elements TBT, for example, through signal lines in the display area DA. The plurality of to-be-tested elements TBT are tested using the connection pad CPD to ensure they are functioning properly. The connection pad CPD is in a connection pad area CPA. In FIG. 1, the connection pad area CPA is in the peripheral area PA. Alternatively, the connection pad CPD or at least a portion of the connection pad CPD may be disposed in the display area DA, and the connection pad area CPA or at least a portion of the connection pad area CPA is inside the display area DA. Optionally, the connection pad is a test pad. Optionally, the connection lines are test lines. Optionally, the connection pad area CPA is a test pad area.

Figure 2:
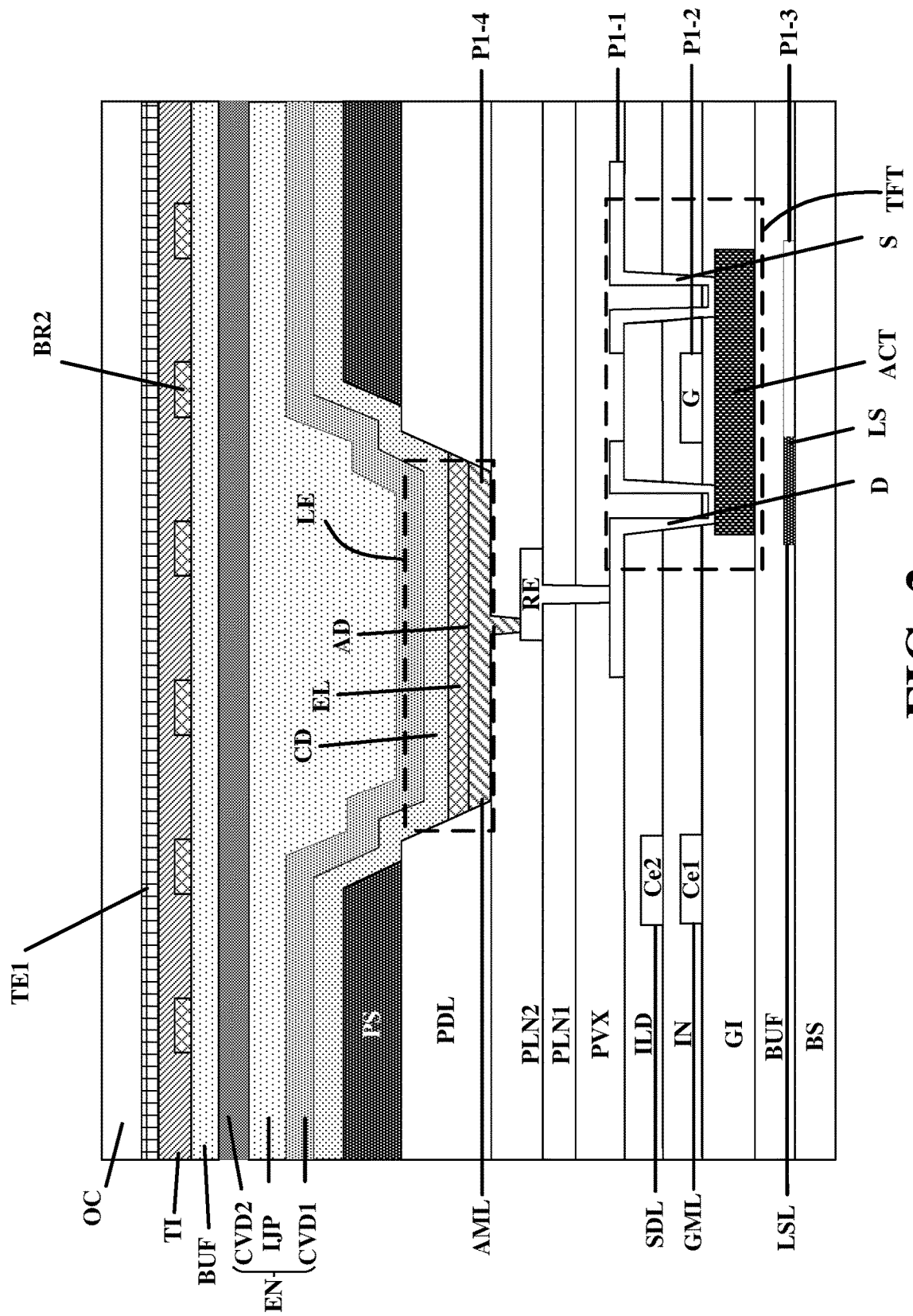
FIG. 2 illustrates a detailed structure in a display area in an array substrate in some embodiments according to the present disclosure.

FIG. 2 illustrates a detailed structure in a display area in an array substrate in some embodiments according to the present disclosure. Referring to FIG. 2, the array substrate in the display area in some embodiments includes a base substrate BS (e.g., a flexible base substrate); an active layer ACT of a respective one of a plurality of thin film transistors TFT on the base substrate BS; a gate insulating layer GI on a side of the active layer ACT away from the base substrate BS; a gate electrode G and a first capacitor electrode Ce1 (both are parts of a first gate metal layer) on a side of the gate insulating layer GI away from the base substrate BS; an insulating layer IN on a side of the gate electrode G and the first capacitor electrode Ce1 away from the gate insulating layer GI; a second capacitor electrode Ce2 (a part of a second gate metal layer) on a side of the insulating layer IN away from the gate insulating layer GI; an inter-layer dielectric layer ILD on a side of the second capacitor electrode Ce2 away from the gate insulating layer GI; a source electrode S and a drain electrode D (parts of a first SD metal layer) on a side of the inter-layer dielectric layer ILD away from the gate insulating layer GI; a passivation layer PVX on a side of the source electrode S and the drain electrode D away from the inter-layer dielectric layer ILD; a first planarization layer PLN1 on a side of the passivation layer PVX away from the inter-layer dielectric layer ILD; a second planarization layer PLN2 on side of the first planarization layer PLN1 away from the passivation layer PVX; a relay electrode RE (part of a second SD metal layer) on a side of the second planarization layer PLN2 away from the first planarization layer PLN1; a pixel definition layer PDL defining a subpixel aperture and on a side of the second planarization layer PLN2 away from the base substrate BS; and a light emitting element LE in the subpixel aperture. The light emitting element LE includes an anode AD on a side of the second planarization layer PLN2 away from the first planarization layer PLN1; a light emitting layer EL on a side of the anode AD away from the second planarization layer PLN2; and a cathode layer CD on a side of the light emitting layer EL away from the anode AD. The array substrate in the display area further includes an encapsulating layer EN encapsulating the dummy light emitting element DLE, and on a side of the cathode layer CD away from the base substrate BS. The encapsulating layer EN in some embodiments includes a first inorganic encapsulating sub-layer CVD1 on a side of the cathode layer CD away from the base substrate BS, an organic encapsulating sub-layer IJP on a side of the first inorganic encapsulating sub-layer CVD1 away from the base substrate BS, and a second inorganic encapsulating sub-layer CVD2 on a side of the organic encapsulating sub-layer IJP away from the first inorganic encapsulating sub-layer CVD1. The array substrate in the display area further includes a buffer layer BUF on a side of the encapsulating layer EN away from the base substrate BS; a plurality of second electrode bridges BR2 on a side of the buffer layer BUF away from the encapsulating layer EN; a touch insulating layer TI on a side of the plurality of second electrode bridges BR2 away from the buffer layer BUF; a plurality of first touch electrodes TE1 on a side of the touch insulating layer TI away from the buffer layer BUF; and an overcoat layer OC on a side of the plurality of first touch electrodes TE1 away from the touch insulating layer TI. Optionally, the array substrate in the display area does not include the passivation layer PVX, e.g., the inter-layer dielectric layer ILD is in direct contact with the first planarization layer PLN1.

In some embodiments, the array substrate includes a base substrate; a second conductive layer on the base substrate; and a first conductive layer on a side of the second conductive layer away from the base substrate. In some embodiments, referring to FIG. 2, the first conductive layer and the second conductive layer are two different layers selected from a gate metal layer GML, a source-drain electrode layer SDL, or a light shielding layer LSL. In one example, the first conductive layer is the source-drain electrode layer SDL, and the second conductive layer is the gate metal layer GML. In another example, the first conductive layer is the source-drain electrode layer SDL, and the second conductive layer is the light shielding layer LSL. In another example, the first conductive layer is the gate metal layer GML, and the second conductive layer is the light shielding layer LSL.

Referring to FIG. 2, in one example, the second conductive layer is a gate metal layer GML, which includes, for example, a plurality of gate lines and a plurality of gate electrodes G of a plurality of thin film transistor TFT. In another example, the first conductive layer is a source-drain electrode layer SDL, which includes, for example, a plurality of source electrode S and a plurality of drain electrodes D of the plurality of thin film transistor TFT.

In some embodiments, the array substrate includes a base substrate; a third conductive layer on the base substrate; a second conductive layer on a side of the third conductive layer away from the base substrate, and a first conductive layer on a side of the second conductive layer away from the base substrate. In some embodiments, referring to FIG. 2, the first conductive layer is the source-drain electrode layer SDL, the second conductive layer is the gate metal layer GML, and the third conductive layer is the light shielding layer LSL.

Figure 3:
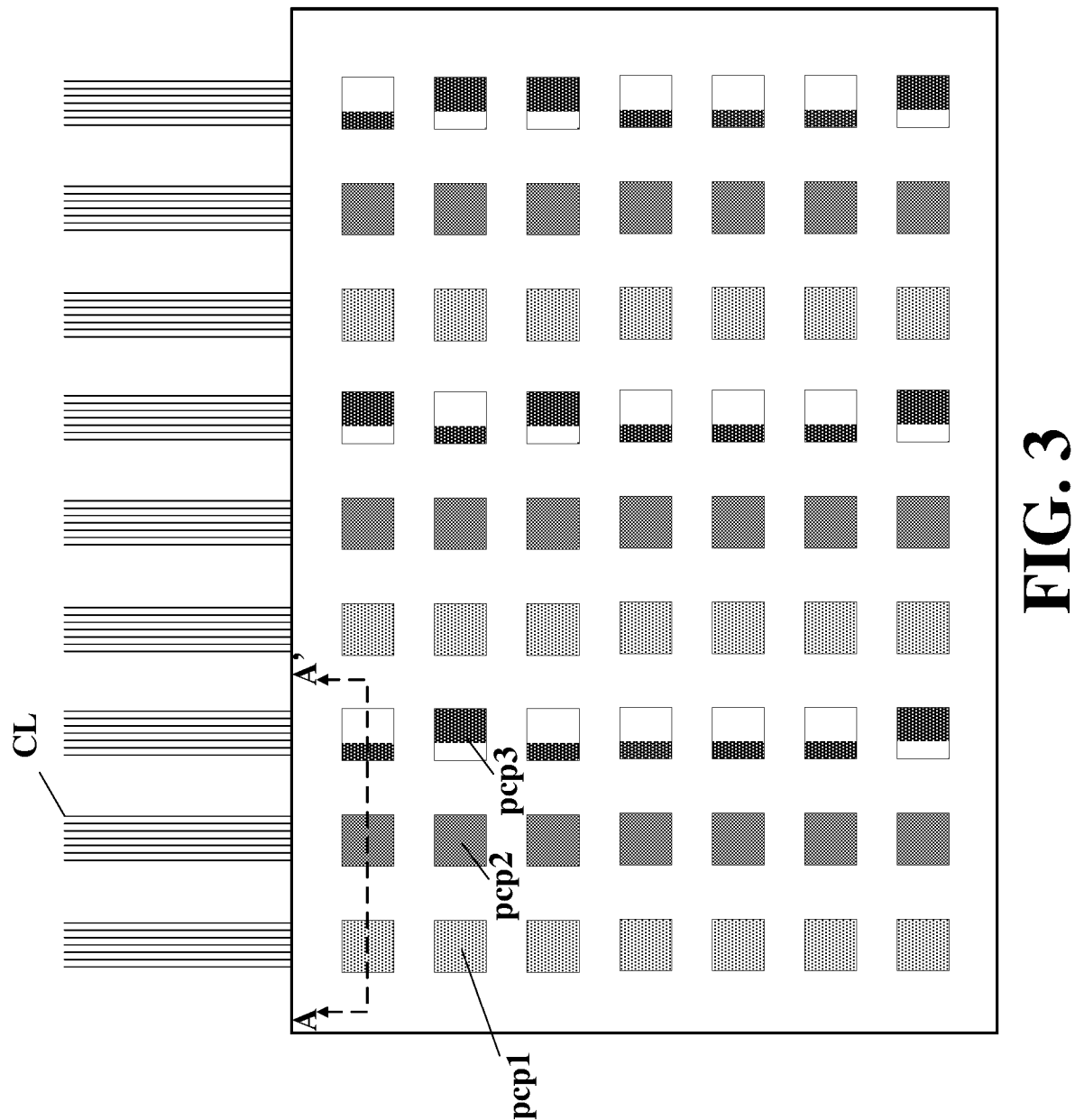
FIG. 3 is a schematic diagram illustrating the structure of a connection pad in a connection pad area of an array substrate in some embodiments according to the present disclosure.

In some embodiments, the connection pad includes a plurality of first probe contact pads, a plurality of second probe contact pads, a plurality of first connection lines coupled to the plurality of first probe contact pads, respectively, and a plurality of second connection lines coupled to the plurality of second probe contact pads, respectively; the plurality of first connection lines and the plurality of second connection lines being in two different layers. FIG. 3 is a schematic diagram illustrating the structure of a connection pad in a connection pad area of an array substrate in some embodiments according to the present disclosure. In one example, FIG. 3 may be a zoom-in view of a first zoom-in region ZR1 in FIG. 1. Referring to FIG. 3, in one example, the connection pad includes a plurality of first probe contact pads pcp1, a plurality of second probe contact pads pcp2, a plurality of third probe contact pads pcp3, and a plurality of connection lines CL coupled to the plurality of first probe contact pads pcp1, the plurality of second probe contact pads pcp2, or the plurality of third probe contact pads pcp3. A respective probe contact pad is configured to receive a probe needle for testing.

Figure 4:
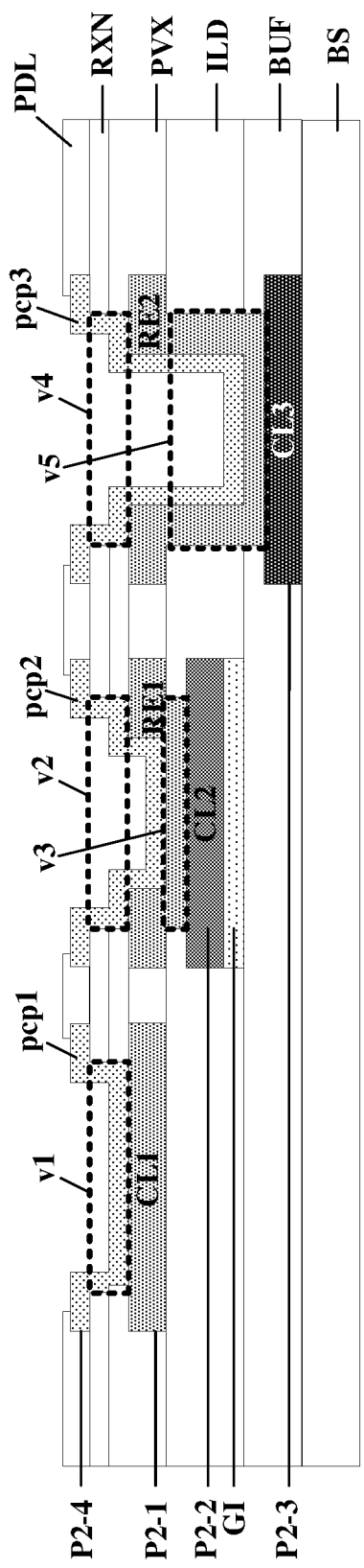
FIG. 4 is a cross-sectional view along an A-A' line in FIG. 3.

FIG. 4 is a cross-sectional view along an A-A' line in FIG. 3. As shown in FIG. 4, the connection pad includes a plurality of first probe contact pads pcp1, a plurality of second probe contact pads pcp2, a plurality of first connection lines CL1 coupled to the plurality of first probe contact pads pcp1, respectively, and a plurality of second connection lines CL2 coupled to the plurality of second probe contact pads pcp2, respectively. Optionally, the connection pad further includes a plurality of third probe contact pads pcp3, and a plurality of third connection lines CL3 coupled to the plurality of third probe contact pads pcp3, respectively. The plurality of first connection lines CL1 and the plurality of second connection lines CL2 are in two different layers. Optionally, the plurality of first connection lines CL1, the plurality of second connection lines CL2, and the plurality of third connection lines CL3 are in three different layers.

In some embodiments, a total number of conductive layers electrically connected to a respective first connection line of the plurality of first connection lines CL1 is different from a total number of conductive layers electrically connected to a respective second connection line of the plurality of second connection lines CL2. Referring to FIG. 4, the respective first connection line is electrically connected to a total of one conductive layer (pcp1), the respective second connection line is electrically connected to a total of two conductive layers (pcp2 and RE1).

In some embodiments, a total number of conductive layers electrically connected to a respective first connection line of the plurality of first connection lines CL1 is different from a total number of conductive layers electrically connected to a respective third connection line of the plurality of third connection lines CL3. Referring to FIG. 4, the respective first connection line is electrically connected to a total of one conductive layer (pcp1), the respective second connection line is electrically connected to a total of two conductive layers (pcp2 and RE1), the respective third connection line is electrically connected to a total of two conductive layers (pcp3 and RE2). Optionally, the total number of conductive layers electrically connected to a respective third connection line of the plurality of third connection lines CL3 is the same as the total number of conductive layers electrically connected to a respective second connection line of the plurality of second connection lines CL2.

Figure 5:
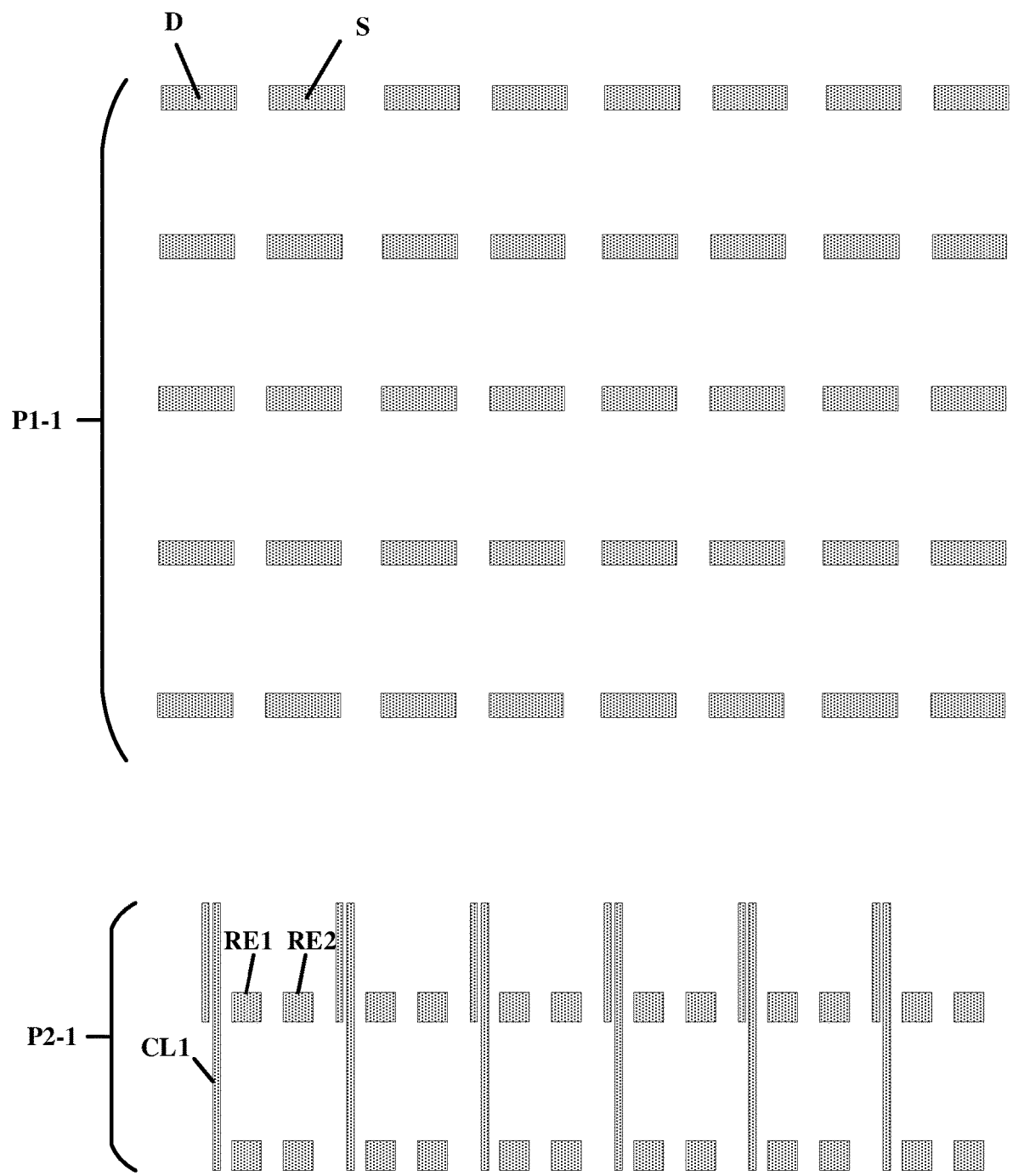
FIG. 5 is a diagram illustrating the structure of a source-drain electrode layer in an array substrate depicted in FIG. 1.

FIG. 5 is a diagram illustrating the structure of a source-drain electrode layer in an array substrate depicted in FIG. 1. Referring to FIG. 1, FIG. 2, FIG. 4, and FIG. 5, in some embodiments, the first conductive layer is a source-drain electrode layer SDL. The first conductive layer includes a first-first portion P1-1 in a display area DA of the array substrate and a second-first portion P2-1 in the connection pad area CPA. The first-first portion P1-1 and the second-first portion P2-1 are in a same layer. As used herein, the term "same layer" refers to the relationship between the layers simultaneously formed in the same step. In one example, the first-first portion P1-1 and the second-first portion P2-1 are in a same layer when they are formed as a result of one or more steps of a same patterning process performed in a material deposited in a same deposition process. In another example, the first-first portion P1-1 and the second-first portion P2-1 can be formed in a same layer by simultaneously performing the step of forming the first-first portion P1-1 and the step of forming the second-first portion P2-1. The term "same layer" does not always mean that the thickness of the layer or the height of the layer in a cross-sectional view is the same.

Referring to FIG. 2 and FIG. 5, the first-first portion P1-1 in some embodiments includes a plurality of source electrodes S and a plurality of drain electrodes D of a plurality of thin film transistors TFT. Referring to FIG. 4 and FIG. 5, the second-first portion P2-1 in some embodiments includes the plurality of first connection lines CL1. Referring to FIG. 2, FIG. 4, and FIG. 5, the plurality of source electrodes S and the plurality of drain electrodes D are in a same layer as the plurality of first connection lines CL1.

Figure 6:
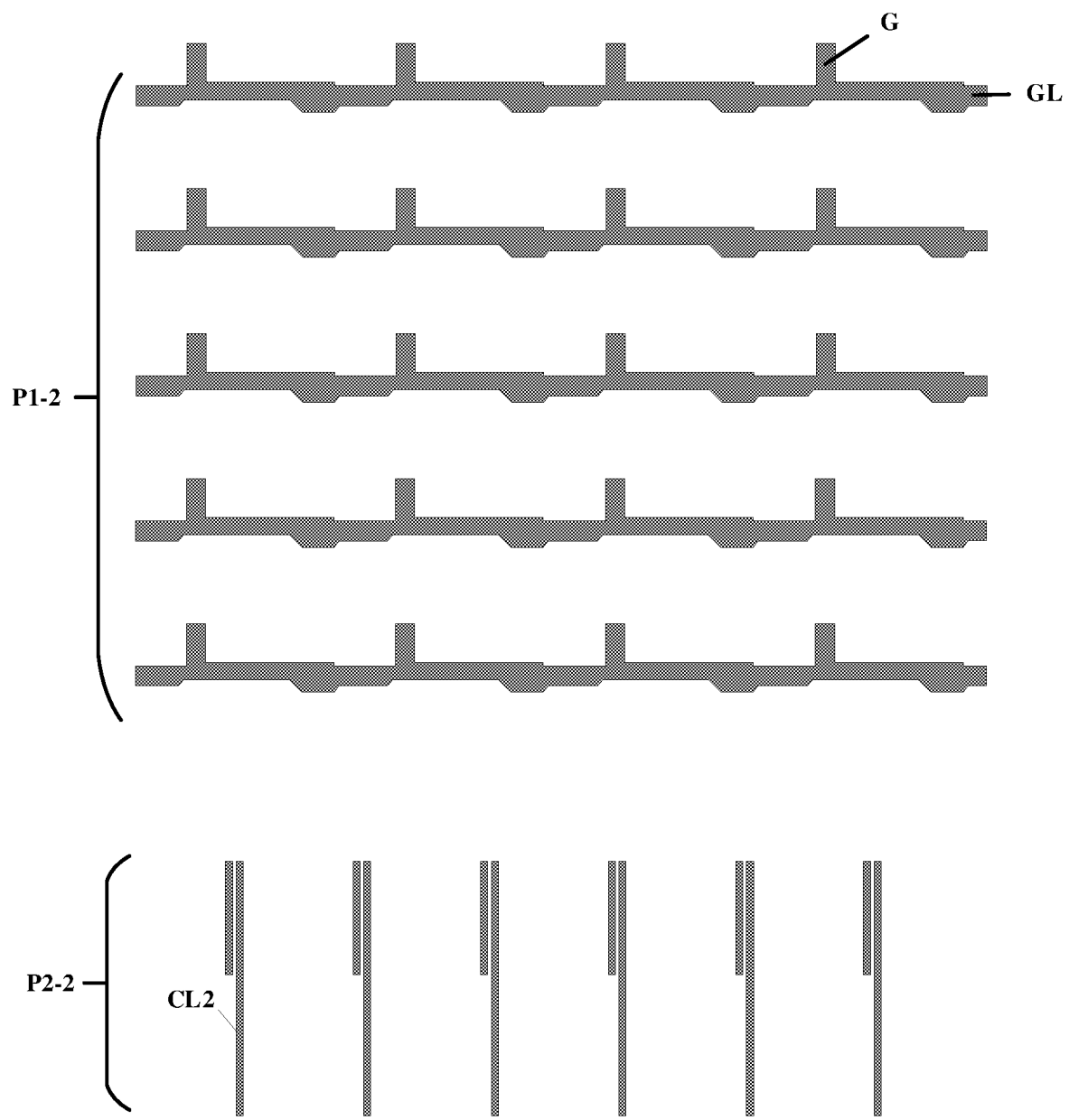
FIG. 6 is a diagram illustrating the structure of a gate metal layer in an array substrate depicted in FIG. 1.

FIG. 6 is a diagram illustrating the structure of a gate metal layer in an array substrate depicted in FIG. 1. Referring to FIG. 1, FIG. 2, FIG. 4, and FIG. 6, in some embodiments, the second conductive layer is a gate metal layer GML. The second conductive layer includes a first-second portion P1-2 in a display area DA of the array substrate and a second-second portion P2-2 in the connection pad area CPA. The first-second portion P1-2 and the second-second portion P2-2 are in a same layer.

Referring to FIG. 2 and FIG. 6, the first-second portion P1-2 in some embodiments includes a plurality of gate lines GL, and a plurality of gate electrode G of the plurality of thin film transistors TFT. Referring to FIG. 4 and FIG. 6, the second-second portion P2-2 in some embodiments includes the plurality of second connection lines CL2. Referring to FIG. 2, FIG. 4, and FIG. 6, the plurality of gate lines GL and the plurality of gate electrodes G are in a same layer as the plurality of second connection lines CL2.

Figure 7:
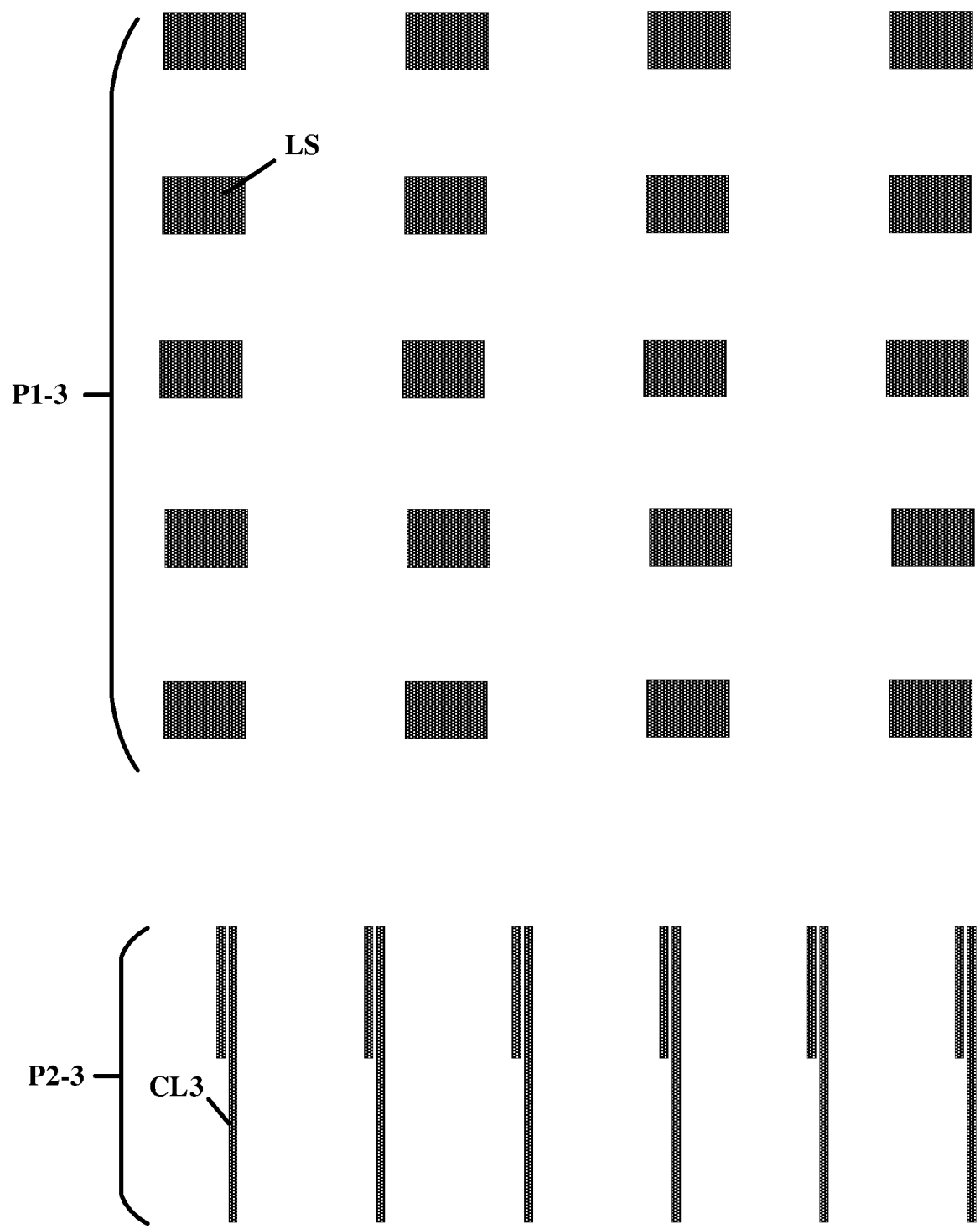
FIG. 7 is a diagram illustrating the structure of a light shielding layer in an array substrate depicted in FIG. 1.

FIG. 7 is a diagram illustrating the structure of a light shielding layer in an array substrate depicted in FIG. 1. Referring to FIG. 1, FIG. 2, FIG. 4, and FIG. 7, in some embodiments, the third conductive layer is a light shielding layer LSL. The third conductive layer includes a first-third portion P1-3 in a display area DA of the array substrate and a second-third portion P2-3 in the connection pad area CPA. The first-third portion P1-3 and the second-third portion P2-3 are in a same layer.

Referring to FIG. 2 and FIG. 7, the first-third portion P1-3 in some embodiments includes a plurality of light shields LS. Referring to FIG. 4 and FIG. 6, the second-third portion P2-3 in some embodiments includes the plurality of third connection lines CL3. Referring to FIG. 2, FIG. 4, and FIG. 7, the plurality of light shields LS are in a same layer as the plurality of third connection lines CL3. An orthographic projection of a respective light shield on the base substrate BS covers a respective active layer of a respective thin film transistor TFT.

In one example as depicted in FIG. 3, the connection pad includes a plurality of columns of probe contact pads. A respective column of probe contact pads are coupled to connection lines in a same layer. Referring to FIG. 2, FIG. 3 to FIG. 7, in some embodiments, an orthographic projection of a respective first connection line on the base substrate BS is non-overlapping with an orthographic projection of a respective second connection line on the base substrate BS. Optionally, the orthographic projection of the respective first connection line on the base substrate BS is non-overlapping with an orthographic projection of a respective third connection line on the base substrate BS. Optionally, the orthographic projection of the respective second connection line on the base substrate BS is non-overlapping with the orthographic projection of the respective third connection line on the base substrate BS.

Figure 8:
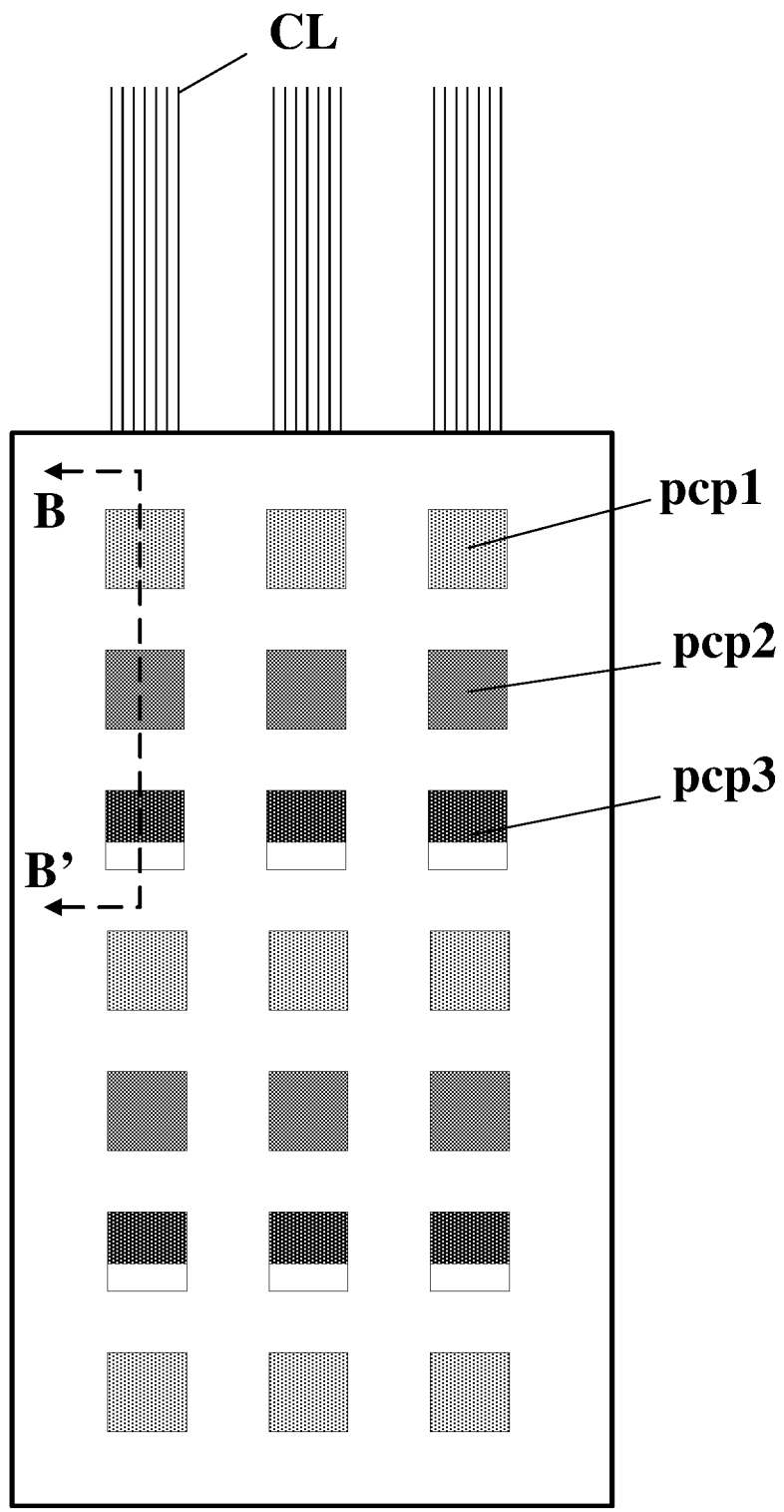
FIG. 8 is a schematic diagram illustrating the structure of a connection pad in a connection pad area of an array substrate in some embodiments according to the present disclosure.
Figure 9:
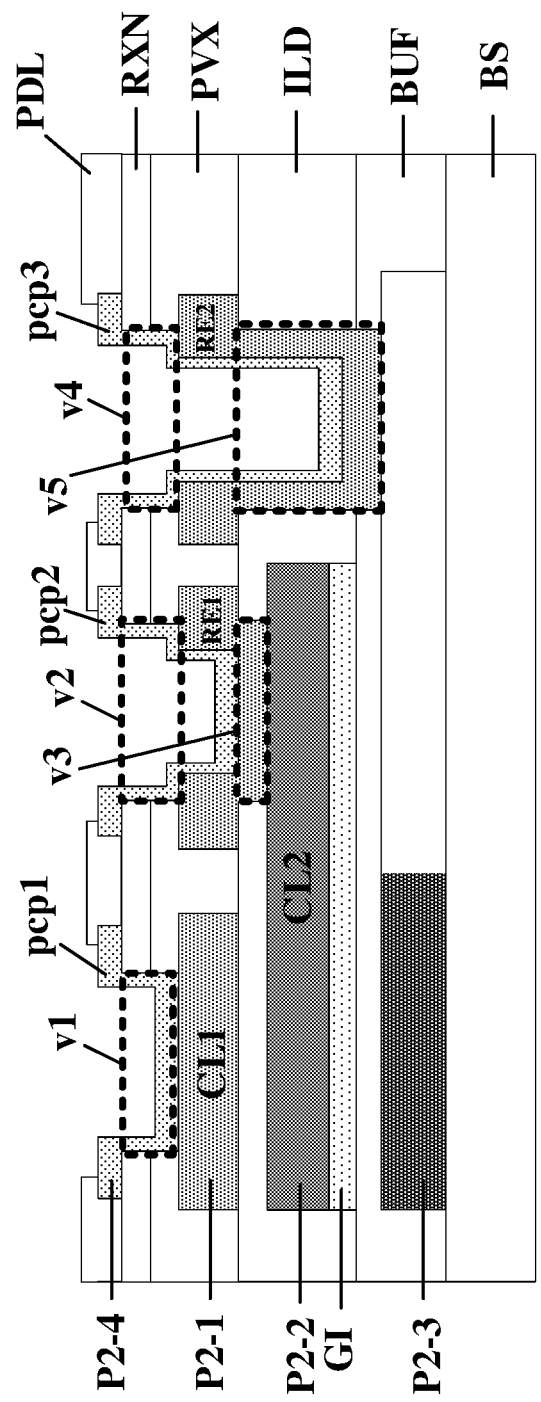
FIG. 9 is a cross-sectional view along a B-B' line in FIG. 8.
Figure 10:
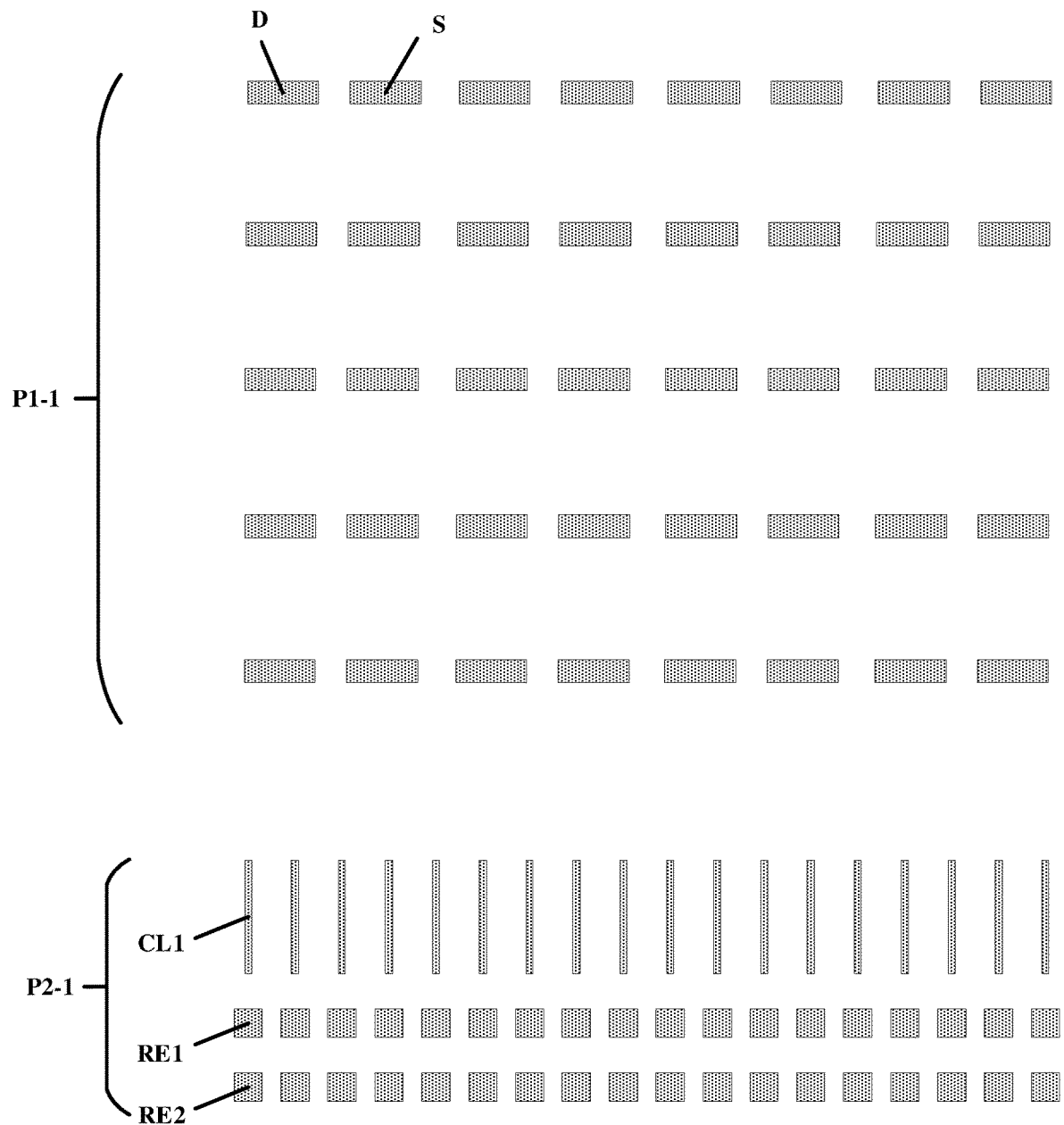
FIG. 10 is a diagram illustrating the structure of a source-drain electrode layer in an array substrate depicted in FIG. 1.
Figure 11:
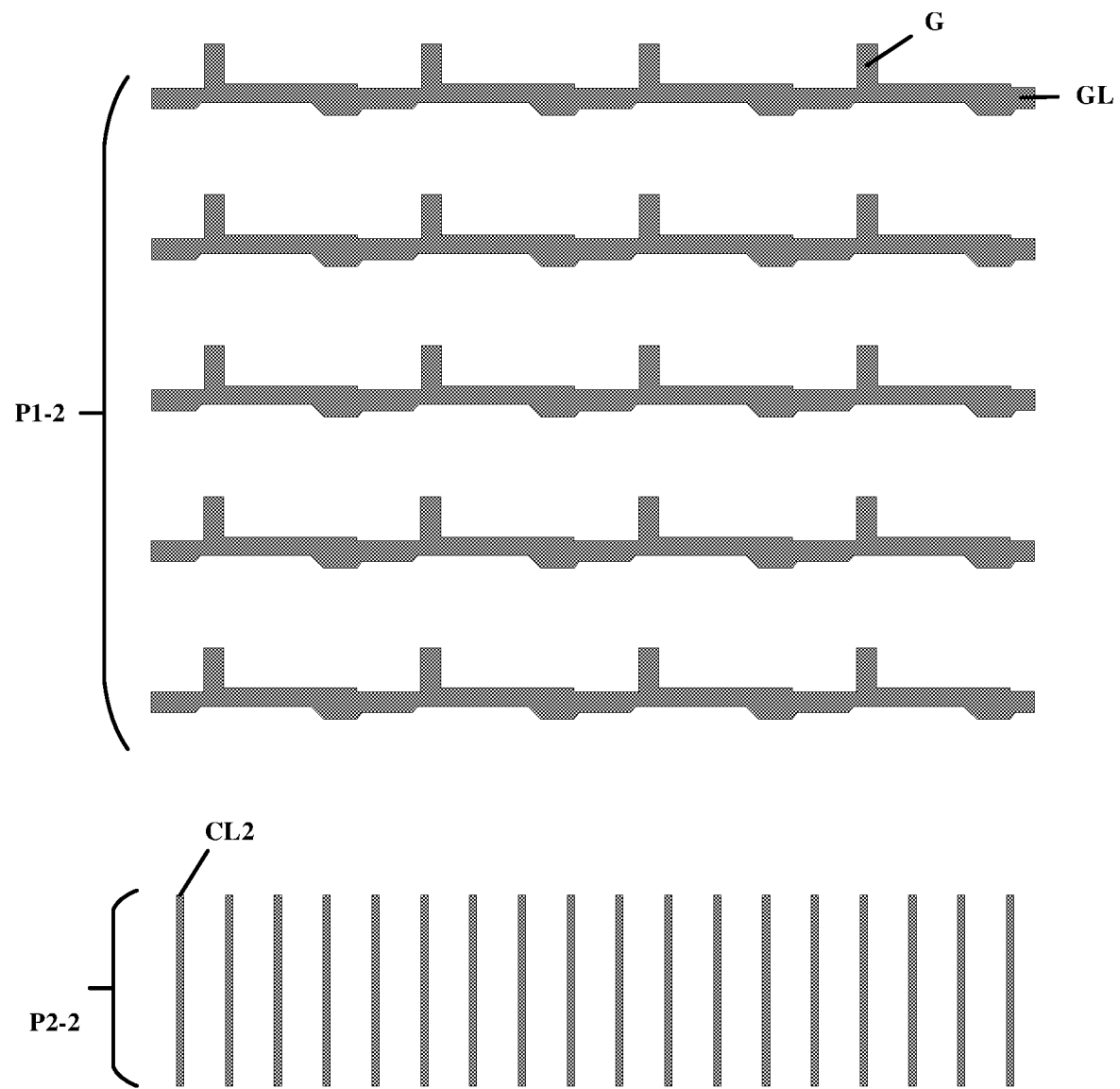
FIG. 11 is a diagram illustrating the structure of a gate metal layer in an array substrate depicted in FIG. 1.
Figure 12:
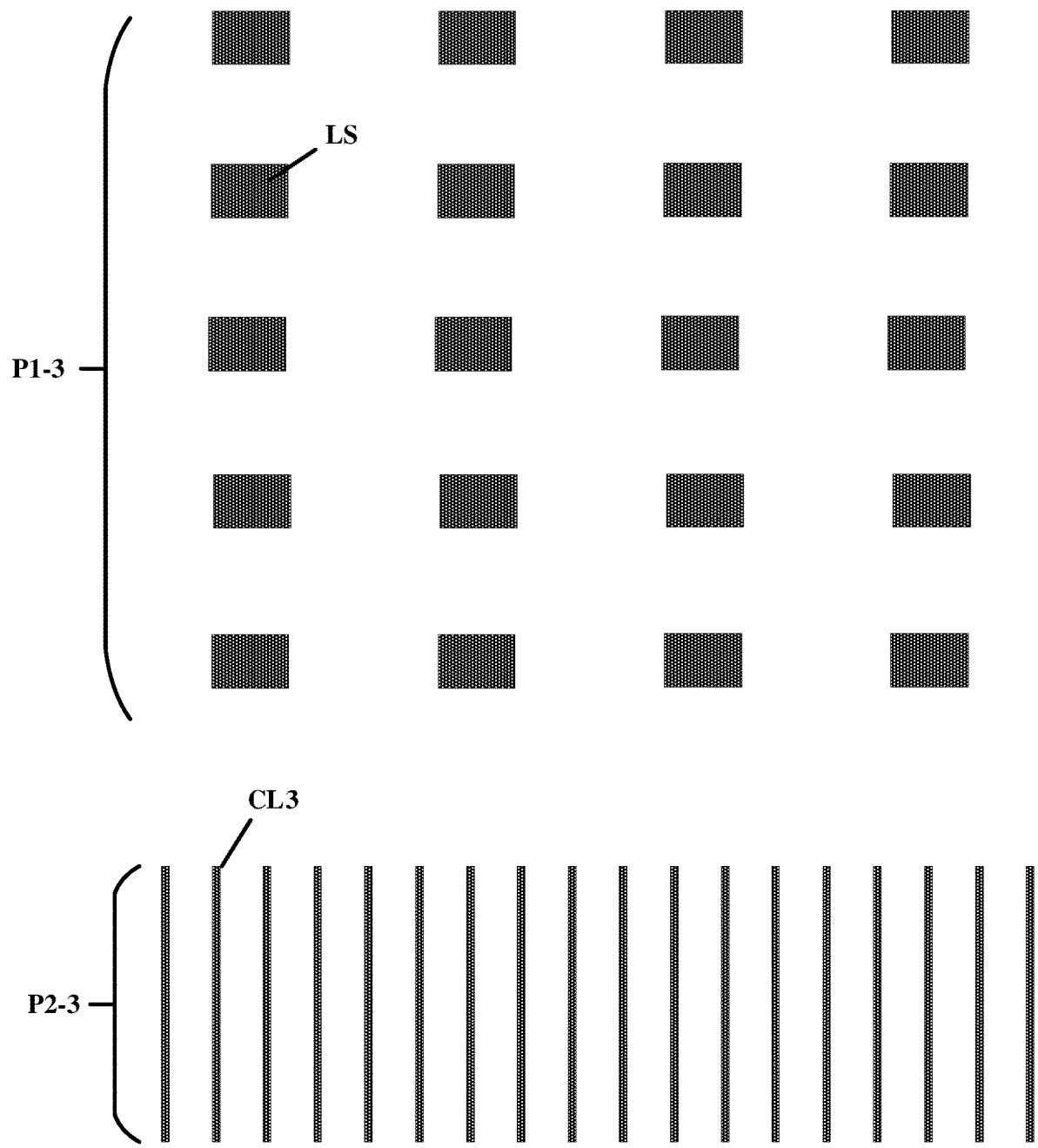
FIG. 12 is a diagram illustrating the structure of a light shielding layer in an array substrate depicted in FIG. 1.

FIG. 8 is a schematic diagram illustrating the structure of a connection pad in a connection pad area of an array substrate in some embodiments according to the present disclosure. For example, FIG. 8 may be a zoom-in view of a second zoom-in region ZR2 in FIG. 1. Referring to FIG. 8, in one example, the connection pad includes a plurality of first probe contact pads pcp1, a plurality of second probe contact pads pcp2, a plurality of third probe contact pads pcp3, and a plurality of connection lines CL coupled to the plurality of first probe contact pads pcp1, the plurality of second probe contact pads pcp2, or the plurality of third probe contact pads pcp3. FIG. 9 is a cross-sectional view along a B-B' line in FIG. 8. FIG. 10 is a diagram illustrating the structure of a source-drain electrode layer in an array substrate depicted in FIG. 1. FIG. 11 is a diagram illustrating the structure of a gate metal layer in an array substrate depicted in FIG. 1. FIG. 12 is a diagram illustrating the structure of a light shielding layer in an array substrate depicted in FIG. 1.

In one example as depicted in FIG. 8, the connection pad includes a plurality of columns of probe contact pads. Probe contact pads in a respective column of probe contact pads are coupled to connection lines in different layers, respectively. Referring to FIG. 2, FIG. 8 to FIG. 12, in some embodiments, an orthographic projection of a respective first connection line on the base substrate BS is at least partially overlapping with an orthographic projection of a respective second connection line on the base substrate BS. Optionally, the orthographic projection of the respective first connection line on the base substrate BS is at least partially overlapping with an orthographic projection of a respective third connection line on the base substrate BS. Optionally, the orthographic projection of the respective second connection line on the base substrate BS is at least partially overlapping with the orthographic projection of the respective third connection line on the base substrate BS.

As compared to related products, the present connection pad in the present array substrate occupies much less space. For example, the connection pad having the structure as depicted in FIG. 3 to FIG. 7 can save up to 70% of space as compared to the connection pad in related products. The connection pad having the structure as depicted in FIG. 8 to FIG. 12 can save up to 85% of space as compared to the connection pad in related products. The structure of the array substrate makes it possible to reduce or combine space for disposing connection lines. Particularly, when the fourth conductive layer is made of a transparent conductive material such as indium tin oxide, it is relatively easier to make the probe contact pads smaller in size, due to a relatively high fabrication accuracy with respect to the transparent conductive material. However, it is more difficult to fabricate the connection lines with smaller widths when the connection lines are made of metallic materials. The inventors of the present disclosure discover that, surprisingly and unexpectedly, the intricate structure of the present array substrate results in a significantly more compact connection pad by reducing and/or combining spaces for connection lines. The present array substrate is particularly suitable for high resolution, small bezel area display apparatus.

In some embodiments, the array substrate includes an insulating layer between the second-first portion and the second-second portion. Optionally, the insulating layer includes an inter-layer dielectric layer. Optionally, the insulating layer includes a buffer layer. Optionally, the insulating layer includes a combination of the inter-layer dielectric layer and the buffer layer. Referring to FIG. 4 and FIG. 9, in one example, the array substrate includes an inter-layer dielectric layer ILD between the second-first portion P2-1 and the second-second portion P2-2. In one example, the second-first portion P2-1 (including the plurality of first connection lines CL1) is in direct contact with the inter-layer dielectric layer ILD, and the second-second portion P2-2 (including the plurality of second connection lines CL2) is in direct contact with the inter-layer dielectric layer ILD.

In some embodiments, the array substrate includes another insulating layer between the second-second portion and the second-third portion. Referring to FIG. 4 and FIG. 9, in one example, the array substrate includes an inter-layer dielectric layer ILD between the second-first portion P2-1 and the second-second portion P2-2; and a buffer layer BUF between the second-second portion P2-2 and the second-third portion P2-3. In one example, the second-first portion P2-1 (including the plurality of first connection lines CL1) is in direct contact with the inter-layer dielectric layer ILD, the second-second portion P2-2 (including the plurality of second connection lines CL2) is in direct contact with the inter-layer dielectric layer ILD, and the second-third portion P2-3 (including the plurality of third connection lines CL3) is in direct contact with the buffer layer BUF.

Referring to FIG. 2, FIG. 4, and FIG. 9, in some embodiments, the array substrate further includes a gate insulating layer GI on a side of the buffer layer BUF away from the base substrate BS. The gate metal layer GML is between the gate insulating layer GI and the inter-layer dielectric layer ILD. In one example, the second-second portion P2-2 (including the plurality of second connection lines CL2) is in direct contact with the gate insulating layer GI on a side, and in direct contact with the inter-layer dielectric layer ILD on another side.

Referring to FIG. 4, FIG. 5, FIG. 9, and FIG. 10, in some embodiments the second-first portion further includes a plurality of first relay electrodes RE1 in a same layer as the plurality of first connection lines CL1. A respective first relay electrode of the plurality of first relay electrodes RE1 connects a respective second probe contact pad of the plurality of second probe contact pads pcp2 to a respective second connection line of the plurality of second connection lines CL2. The plurality of source electrodes S and the plurality of drain electrodes D are in a same layer as the plurality of first connection lines CL1 and the plurality of first relay electrodes RE1.

Referring to FIG. 4, FIG. 5, FIG. 9, and FIG. 10, in some embodiments the second-first portion further includes a plurality of second relay electrodes RE2 in a same layer as the plurality of first connection lines CL1. A respective second relay electrode of the plurality of second relay electrodes RE2 connects a respective third probe contact pad of the plurality of third probe contact pads pcp3 to a respective third connection line of the plurality of third connection lines CL3. The plurality of source electrodes S and the plurality of drain electrodes D are in a same layer as the plurality of first connection lines CL1, the plurality of first relay electrodes RE1, and the plurality of second relay electrodes RE2.

Referring to FIG. 4 and FIG. 9, in some embodiments, the array substrate in the connection pad area includes a base substrate BS, a plurality of third connection lines CL3 on the base substrate BS, a buffer layer BUF on a side of the plurality of connection lines CL3 away from the base substrate BS, a gate insulating layer GI on a side of the buffer layer BUF away from the base substrate BS, a plurality of second connection lines CL2 on a side of the gate insulating layer GI and the buffer layer BUF away from the base substrate BS, an inter-layer dielectric layer ILD on a side of the plurality of second connection lines CL2 away from the base substrate BS, a plurality of first connection lines CL1, a plurality of first relay electrodes RE1, and a plurality of second relay electrodes RE2 on a side of the inter-layer dielectric layer ILD away from the base substrate BS, a passivation layer PVX on a side of the plurality of first connection lines CL1, the plurality of first relay electrodes RE1, and the plurality of second relay electrodes RE2 away from the base substrate BS, a resin layer RXN on a side of the passivation layer PVX away from the base substrate BS, a plurality of first probe contact pads pcp1, a plurality of second probe contact pads pcp2, and a plurality of third probe contact pads pcp3 on a side of the resin layer RXN away from the base substrate BS, and a pixel definition layer PDL on a side of the plurality of first probe contact pads pcp1, the plurality of second probe contact pads pcp2, and the plurality of third probe contact pads pcp3 away from the base substrate BS.

Referring to FIG. 4 and FIG. 9, in some embodiments, the array substrate in the connection pad area includes a first via v1 extending through the resin layer RXN and the passivation layer PVX, a respective first probe contact pad connected to a respective first connection line through the first via v1; a second via v2 extending through the resin layer RXN and the passivation layer PVX, a respective second probe contact pad connected to the respective first relay electrode through the second via v2; and a third via v3 extending through the inter-layer dielectric layer ILD, the respective first relay electrode connected to a respective second connection line through the third via v3. Optionally, the array substrate in the connection pad area further includes a fourth via v4 extending through the resin layer RXN and the passivation layer PVX, a respective third probe contact pad connected to the respective second relay electrode through the fourth via v4; and a fifth via v5 extending through the inter-layer dielectric layer ILD and the buffer layer BUF, the respective second relay electrode connected to a respective third connection line through the fifth via v5.

Referring to FIG. 2, FIG. 4, and FIG. 9, in some embodiments, the plurality of first probe contact pads pcp1, the plurality of second probe contact pads pcp2, or the plurality of third probe contact pads pcp3 are in a same layer as an anode AD of the light emitting element LE in the display area DA.

In some embodiments, the array substrate includes a fourth conductive layer. In one example, the fourth conductive layer is an anode material layer AML. Referring to FIG. 2, FIG. 4, and FIG. 9, the fourth conductive layer includes a first-fourth portion P1-4 in a display area of the array substrate and a second-fourth portion P2-4 in the connection pad area. The first-fourth portion P1-4 includes the anode AD of the light emitting element LE. The second-fourth portion P2-4 includes the plurality of first probe contact pads pcp1, the plurality of second probe contact pads pcp2, or the plurality of third probe contact pads pcp3.

Referring to FIG. 1, in one example, a respective to-be-tested element of the plurality of to-be-tested elements TBT is a transistor. Referring to FIG. 4 and FIG. 9, in one example, a respective first connection line of the plurality of first connection lines CL1, a respective second connection line of the plurality of second connection lines CL2, and a respective third connection line of the plurality of third connection lines CL3 are coupled to three electrodes selected from a source electrode, a drain electrode, and a gate electrode of the transistor to be tested. In another example, the respective first connection line is coupled to the source electrode of the transistor, the respective second connection line is coupled to the gate electrode of the transistor, and the respective third connection line is coupled to the drain electrode of the transistor. In another example, the respective first connection line is coupled to the drain electrode of the transistor, the respective second connection line is coupled to the gate electrode of the transistor, and the respective third connection line is coupled to the source electrode of the transistor.

Figure 13A:
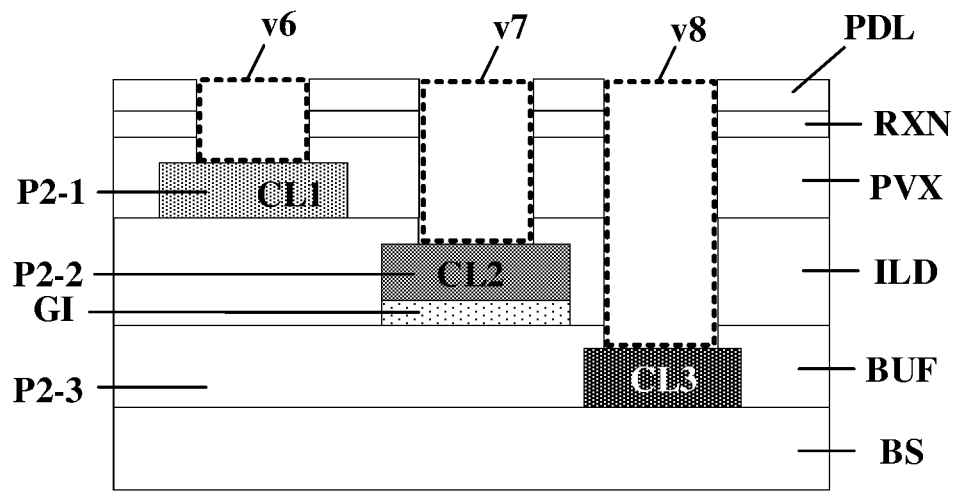
FIG. 13A is a cross-sectional view of an array substrate in some embodiments according to the present disclosure.
Figure 13B:
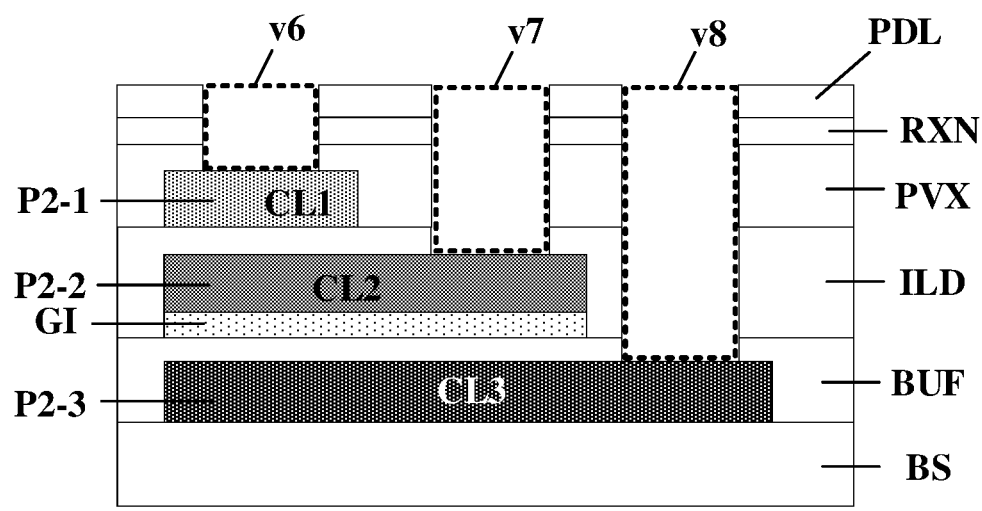
FIG. 13B is a cross-sectional view of an array substrate in some embodiments according to the present disclosure.

FIG. 13A is a cross-sectional view of an array substrate in some embodiments according to the present disclosure. FIG. 13B is a cross-sectional view of an array substrate in some embodiments according to the present disclosure. Referring to FIG. 13A and FIG. 13B, the connection pad in some embodiments does not include probe contact pads and relay electrodes. For example, the plurality of first probe contact pads pcp1, the plurality of second probe contact pads pcp2, the plurality of third probe contact pads pcp3, the plurality of first relay electrodes RE1, and the plurality of second relay electrodes RE2 are absent in the connection pad. In some embodiments, referring to FIG. 13A and FIG. 13B, the connection lines are configured to directly receive probe needles for testing.

As shown in FIG. 13A and FIG. 13B, in one example, a six via v6 extends through the pixel definition layer PDL, the resin layer RXN, and the passivation layer PVX, allowing a probe needle to be in contact with a respective one of the plurality of first connection lines CL1. A seventh via v7 extends through the pixel definition layer PDL, the resin layer RXN, the passivation layer PVX, and the inter-layer dielectric layer ILD, allowing a probe needle to be in contact with a respective one of the plurality of second connection lines CL2. An eighth via v8 extends through the pixel definition layer PDL, the resin layer RXN, the passivation layer PVX, the inter-layer dielectric layer ILD, and the buffer layer BUF, allowing a probe needle to be in contact with a respective one of the plurality of third connection lines CL3.

Comparing the connection pads in FIG. 13A and FIG. 13B with the connection pads in FIG. 4 and FIG. 9, the connection pads in FIG. 13A and FIG. 13B occupy even less space because they further eliminates the space needed for disposing the probe contact pads and relay electrodes. The present array substrate is particularly suitable for high resolution, small bezel area display apparatus.

In another aspect, the present invention provides a display apparatus, including the array substrate described herein or fabricated by a method described herein, and one or more integrated circuits connected to the array substrate. Examples of appropriate display apparatuses include, but are not limited to, an electronic paper, a mobile phone, a tablet computer, a television, a monitor, a notebook computer, a digital album, a GPS, etc. Optionally, the display apparatus is an organic light emitting diode display apparatus. Optionally, the display apparatus is a micro light emitting diode display apparatus. Optionally, the display apparatus is a mini light emitting diode display apparatus. Optionally, the display apparatus is a top emission type display apparatus. Optionally, the display apparatus is a bottom emission type display apparatus. Optionally, the display apparatus is a dual emission type display apparatus.

In another aspect, the present disclosure provides a method of fabricating an array substrate. In some embodiments, the method includes forming a connection pad in a connection pad area. In some embodiments, forming the connection pad includes forming a plurality of first probe contact pads, forming a plurality of second probe contact pads, forming a plurality of first connection lines coupled to the plurality of first probe contact pads, respectively, and forming a plurality of second connection lines coupled to the plurality of second probe contact pads, respectively. The plurality of first connection lines and the plurality of second connection lines are formed in two different layers. Optionally, forming the connection pad further includes forming a plurality of third probe contact pads, and forming a plurality of third connection lines coupled to the plurality of third probe contact pads, respectively. The plurality of first connection lines, the plurality of second connection lines, and the plurality of third connection lines are formed in three different layers.

Various appropriate conductive electrode materials and various appropriate fabricating methods may be used to make the first conductive layer. In some embodiments, the conductive electrode material includes a metal material. Examples of appropriate metal materials include, but are not limited to, molybdenum, gold, and aluminum.

Various appropriate conductive electrode materials and various appropriate fabricating methods may be used to make the second conductive layer. For example, a conductive electrode material may be deposited on the substrate by, e.g., sputtering or vapor deposition, and patterned by, e.g., lithography such as a wet etching process to form a gate electrode layer. Examples of appropriate conductive electrode materials include, but are not limited to, aluminum, chromium, tungsten, titanium, tantalum, molybdenum, copper, and alloys or laminates containing the same (e.g., MoNd/Cu/MoNd).

Various appropriate materials and various appropriate fabricating methods may be used for making the third conductive layer. For example, a metallic material may be deposited on the substrate by a plasma-enhanced chemical vapor deposition (PECVD) process. Examples of appropriate metallic materials for making the third conductive layer include, but are not limited to, aluminum, chromium, tungsten, titanium, tantalum, molybdenum, copper, and alloys or laminates containing the same (e.g., AlNd and MoNb).

Various appropriate electrode materials and various appropriate fabricating methods may be used for forming the fourth conductive layer. Optionally, the fourth conductive layer is a transparent anode layer. Optionally, the fourth conductive layer may be formed using a transparent electrode material, e.g., indium tin oxide or nano-silver. Examples of appropriate methods for forming the fourth conductive layer include, but are not limited to, vapor deposition or sputtering.

In another aspect, the present disclosure provides a connection pad. In some embodiments, the connection pad includes a plurality of first probe contact pads, a plurality of second probe contact pads, a plurality of first connection lines coupled to the plurality of first probe contact pads, respectively, and a plurality of second connection lines coupled to the plurality of second probe contact pads, respectively; the plurality of first connection lines and the plurality of second connection lines being in two different layers. Optionally, the connection pad further includes an insulating layer between the plurality of first connection lines and the plurality of second connection lines, the insulating layer including an inter-layer dielectric layer, or a buffer layer, or a combination of the inter-layer dielectric layer and the buffer layer.

In some embodiments, the connection pad further includes a plurality of first relay electrodes in a same layer as the plurality of first connection lines. A respective first relay electrode of the plurality of first relay electrodes connects a respective second probe contact pad to a respective second connection line.

In some embodiments, the connection pad further includes a plurality of third probe contact pads, and a plurality of third connection lines coupled to the plurality of third probe contact pads, respectively. The plurality of first connection lines, the plurality of second connection lines, and the plurality of third connection lines are in three different layers. Optionally, the connection pad further includes an inter-layer dielectric layer between the plurality of first connection lines and the plurality of second connection lines; and a buffer layer between the plurality of second connection lines and the plurality of third connection lines.

In some embodiments, the connection pad further includes a plurality of second relay electrodes in a same layer as the plurality of first connection lines. A respective second relay electrode of the plurality of second relay electrodes connects a respective third probe contact pad to a respective third connection line.

In some embodiments, an orthographic projection of a respective first connection line on the base substrate is non-overlapping with an orthographic projection of a respective second connection line on the base substrate. In some embodiments, an orthographic projection of a respective first connection line on the base substrate is non-overlapping with an orthographic projection of a respective second connection line on the base substrate; the orthographic projection of the respective first connection line on the base substrate is non-overlapping with an orthographic projection of a respective third connection line on the base substrate; and the orthographic projection of the respective second connection line on the base substrate is non-overlapping with the orthographic projection of the respective third connection line on the base substrate.

In some embodiments, an orthographic projection of a respective first connection line on the base substrate is at least partially overlapping with an orthographic projection of a respective second connection line on the base substrate. In some embodiments, an orthographic projection of a respective first connection line on the base substrate is at least partially overlapping with an orthographic projection of a respective second connection line on the base substrate; the orthographic projection of the respective first connection line on the base substrate is at least partially overlapping with an orthographic projection of a respective third connection line on the base substrate; and the orthographic projection of the respective second connection line on the base substrate is at least partially overlapping with the orthographic projection of the respective third connection line on the base substrate.

In some embodiments, the connection pad includes a base substrate, a plurality of third connection lines on the base substrate, a buffer layer on a side of the plurality of connection lines away from the base substrate, a gate insulating layer on a side of the buffer layer away from the base substrate, a plurality of second connection lines on a side of the gate insulating layer and the buffer layer away from the base substrate, an inter-layer dielectric layer on a side of the plurality of second connection lines away from the base substrate, a plurality of first connection lines, a plurality of first relay electrodes, and a plurality of second relay electrodes on a side of the inter-layer dielectric layer away from the base substrate, a passivation layer on a side of the plurality of first connection lines, the plurality of first relay electrodes, and the plurality of second relay electrodes away from the base substrate, a resin layer on a side of the passivation layer away from the base substrate, a plurality of first probe contact pads, a plurality of second probe contact pads, and a plurality of third probe contact pads on a side of the resin layer away from the base substrate, and a pixel definition layer on a side of the plurality of first probe contact pads, the plurality of second probe contact pads, and the plurality of third probe contact pads away from the base substrate.

In some embodiments, the connection pad further includes a first via extending through the resin layer and the passivation layer, a respective first probe contact pad connected to a respective first connection line through the first via; a second via extending through the resin layer and the passivation layer, a respective second probe contact pad connected to the respective first relay electrode through the second via; and a third via extending through the inter-layer dielectric layer, the respective first relay electrode connected to a respective second connection line through the third via. Optionally, the connection pad further includes a fourth via extending through the resin layer and the passivation layer, a respective third probe contact pad connected to the respective second relay electrode through the fourth via; and a fifth via extending through the inter-layer dielectric layer and the buffer layer, the respective second relay electrode connected to a respective third connection line through the fifth via.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate, comprising a connection pad in a connection pad area;
   wherein the connection pad comprises a plurality of first probe contact pads, a plurality of second probe contact pads, a plurality of first connection lines coupled to the plurality of first probe contact pads, respectively, and a plurality of second connection lines coupled to the plurality of second probe contact pads, respectively; the plurality of first connection lines and the plurality of second connection lines being in two different layers; and
   a total number of conductive layers electrically connected to a respective first connection line of the plurality of first connection lines is different from a total number of conductive layers electrically connected to a respective second connection line of the plurality of second connection lines;
   wherein the connection pad further comprises a plurality of third probe contact pads, and a plurality of third connection lines coupled to the plurality of third probe contact pads, respectively; the plurality of first connection lines, the plurality of second connection lines, and the plurality of third connection lines being in three different layers; and
   a total number of conductive layers electrically connected to a respective first connection line of the plurality of first connection lines is different from a total number of conductive layers electrically connected to a respective third connection line of the plurality of third connection lines.

2. The array substrate of claim 1, comprising:
   a base substrate;
   a second conductive layer on the base substrate; and
   a first conductive layer on a side of the second conductive layer away from the base substrate;

wherein the first conductive layer comprises a first-first portion in a display area of the array substrate and a second-first portion in the connection pad area;

the second conductive layer comprises a first-second portion in the display area and a second-second portion in the connection pad area;

the second-first portion comprises the plurality of first connection lines; and the second-second portion comprises the plurality of second connection lines.

3. The array substrate of claim 2, further comprising an insulating layer between the second-first portion and the second-second portion;

wherein the insulating layer comprises an inter-layer dielectric layer, or a buffer layer, or a combination of the inter-layer dielectric layer and the buffer layer.

4. The array substate of claim 2, wherein the first conductive layer and the second conductive layer are two different layers selected from a gate metal layer, a source-drain electrode layer, or a light shielding layer.

5. The array substrate of claim 2, wherein the second-first portion further comprises a plurality of first relay electrodes in a same layer as the plurality of first connection lines;

wherein a respective first relay electrode of the plurality of first relay electrodes connects a respective second probe contact pad to a respective second connection line.

6. The array substrate of claim 5, wherein the first-first portion comprises a plurality of source electrodes and a plurality of drain electrodes of a plurality of thin film transistors; and the plurality of source electrodes and the plurality of drain electrodes are in a same layer as the plurality of first connection lines and the plurality of first relay electrodes.

7. The array substrate of claim 2, wherein the first-second portion comprises a plurality of gate lines, and a plurality of gate electrodes of a plurality of thin film transistors, respectively; and the plurality of gate lines and the plurality of gate electrodes are in a same layer as the plurality of second connection lines.

8. The array substrate of claim 2, wherein the array substrate further comprises a third conductive layer on a side of the second conductive layer closer to the base substrate;

wherein the third conductive layer comprises a first-third portion in the display area and a second-third portion in the connection pad area; and the second-third portion comprises the plurality of third connection lines.

9. The array substrate of claim 8, wherein the second-first portion further comprises a plurality of second relay electrodes in a same layer as the plurality of first connection lines;

wherein a respective second relay electrode of the plurality of second relay electrodes connects a respective third probe contact pad to a respective third connection line.

10. The array substrate of claim 8, wherein the first-third portion comprises a plurality of light shields in a same layer as the plurality of third connection lines; and an orthographic projection of a respective light shield on the base substrate covers a respective active layer of a respective thin film transistor.

11. The array substrate of claim 8, further comprising:

an inter-layer dielectric layer between the second-first portion and the second-second portion; and a buffer layer between the second-second portion and the second-third portion.

12. The array substrate of claim 8, wherein the first conductive layer is a source-drain electrode layer;

the second conductive layer is a gate metal layer; and the third conductive layer is a light shielding layer.

13. The array substrate of claim 1, wherein an orthographic projection of the respective first connection line on a base substrate is non-overlapping with an orthographic projection of the respective second connection line on the base substrate;

the orthographic projection of the respective first connection line on the base substrate is non-overlapping with an orthographic projection of a respective third connection line on the base substrate; and the orthographic projection of the respective second connection line on the base substrate is non-overlapping with the orthographic projection of the respective third connection line on the base substrate.

14. The array substrate of claim 1, wherein an orthographic projection of the respective first connection line on a base substrate is at least partially overlapping with an orthographic projection of the respective second connection line on the base substrate;

the orthographic projection of the respective first connection line on the base substrate is at least partially overlapping with an orthographic projection of a respective third connection line on the base substrate; and the orthographic projection of the respective second connection line on the base substrate is at least partially overlapping with the orthographic projection of the respective third connection line on the base substrate.

15. The array substrate of claim 1, wherein an orthographic projection of the respective first connection line on a base substrate is non-overlapping with an orthographic projection of the respective second connection line on the base substrate.

16. The array substrate of claim 1, wherein an orthographic projection of the respective first connection line on a base substrate is at least partially overlapping with an orthographic projection of the respective second connection line on the base substrate.

17. An array substrate, comprising a connection pad in a connection pad area;

wherein the connection pad comprises a plurality of first probe contact pads, a plurality of second probe contact pads, a plurality of first connection lines coupled to the plurality of first probe contact pads, respectively, and a plurality of second connection lines coupled to the plurality of second probe contact pads, respectively; the plurality of first connection lines and the plurality of second connection lines being in two different layers; and a total number of conductive layers electrically connected to a respective first connection line of the plurality of first connection lines is different from a total number of conductive layers electrically connected to a respective second connection line of the plurality of second connection lines;

wherein the array substrate comprises:

a base substrate;

a second conductive layer on the base substrate;

a first conductive layer on a side of the second conductive layer away from the base substrate;

an inter-layer dielectric layer on a side of the plurality of second connection lines away from the base substrate;

a passivation layer on a side of the plurality of first connection lines away from the base substrate; and a resin layer on a side of the passivation layer away from the base substrate;

wherein the first conductive layer comprises a first-first portion in a display area of the array substrate and a second-first portion in the connection pad area;

the second conductive layer comprises a first-second portion in the display area and a second-second portion in the connection pad area;

the second-first portion comprises the plurality of first connection lines; and the second-second portion comprises the plurality of second connection lines;

wherein the second-first portion further comprises a plurality of first relay electrodes in a same layer as the plurality of first connection lines;

wherein a respective first relay electrode of the plurality of first relay electrodes connects a respective second probe contact pad to a respective second connection line;

wherein the plurality of first probe contact pads and the plurality of second probe contact pads are on a side of the resin layer away from the base substrate;

wherein the array substrate further comprises:

a first via extending through the resin layer and the passivation layer, a respective first probe contact pad connected to the respective first connection line through the first via;

a second via extending through the resin layer and the passivation layer, a respective second probe contact pad connected to the respective first relay electrode through the second via; and a third via extending through the inter-layer dielectric layer, the respective first relay electrode connected to the respective second connection line through the third via.

18. A display apparatus, comprising the array substrate of claim 1, and an integrated circuit connected to the array substrate.

19. A connection pad, comprising a plurality of first probe contact pads, a plurality of second probe contact pads, a plurality of first connection lines coupled to the plurality of first probe contact pads, respectively, and a plurality of second connection lines coupled to the plurality of second probe contact pads, respectively; the plurality of first connection lines and the plurality of second connection lines being in two different layers;

wherein a total number of conductive layers electrically connected to a respective first connection line of the plurality of first connection lines is different from a total number of conductive layers electrically connected to a respective second connection line of the plurality of second connection lines;

wherein the connection pad further comprises a plurality of third probe contact pads, and a plurality of third connection lines coupled to the plurality of third probe contact pads, respectively; the plurality of first connection lines, the plurality of second connection lines, and the plurality of third connection lines being in three different layers; and a total number of conductive layers electrically connected to a respective first connection line of the plurality of first connection lines is different from a total number of conductive layers electrically connected to a respective third connection line of the plurality of third connection lines.

* * * * *